United States Patent
Baba et al.

(10) Patent No.: US 12,519,074 B2
(45) Date of Patent: Jan. 6, 2026

(54) SEMICONDUCTOR CHIP AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Shotaro Baba, Kanazawa Ishikawa (JP); Masatoshi Arai, Hakusan Ishikawa (JP); Katsura Miyashita, Naka Kanagawa (JP); Tsuyoshi Kachi, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 348 days.

(21) Appl. No.: 18/177,072

(22) Filed: Mar. 1, 2023

(65) Prior Publication Data
US 2024/0038713 A1    Feb. 1, 2024

(30) Foreign Application Priority Data
Jul. 29, 2022    (JP) ................... 2022-121506

(51) Int. Cl.
*H01L 23/00* (2006.01)
*H10D 30/66* (2025.01)

(52) U.S. Cl.
CPC .............. *H01L 24/32* (2013.01); *H01L 24/48* (2013.01); *H01L 24/73* (2013.01);
(Continued)

(58) Field of Classification Search
CPC ......... H01L 24/32; H01L 24/48; H01L 24/73; H01L 2224/26145; H01L 2224/3201;
(Continued)

(56) References Cited

U.S. PATENT DOCUMENTS 5,727,727 A    3/1998  Ead
6,166,445 A   12/2000  Kushima
(Continued)

FOREIGN PATENT DOCUMENTS

JP    S56117546 U    9/1981
JP     2732823 B2    3/1998
(Continued)

OTHER PUBLICATIONS

Michael Stadler, "Numerical Simulation of Reflow Soldering", 20th International Conference on Thermal, Mechanical and Multi-Physics Simulation and Experiments in Microelectronics and Microsystems (EuroSimE), 2019, 6 pages, DOI: 10. 1109/EuroSimE. 2019.8724550.
(Continued)

*Primary Examiner* — Vu A Vu
(74) *Attorney, Agent, or Firm* — Kim & Stewart LLP

(57) ABSTRACT

According to one embodiment, a semiconductor chip includes a first electrode, a semiconductor layer, a second electrode, a third electrode, and a metallic layer. The semiconductor layer includes a first portion, a second portion, and a third portion that is located between the first portion and the second portion. The semiconductor layer is provided on a first side of the first electrode in a first direction. The second electrode is over the first portion in the first direction. The third electrode is over the second portion in the first direction. The metallic layer is provided on a second side of the first electrode and is under the third portion in the first direction.

17 Claims, 10 Drawing Sheets

(52) U.S. Cl.
CPC ............... *H01L 2224/26145* (2013.01); *H01L 2224/3201* (2013.01); *H01L 2224/32058* (2013.01); *H01L 2224/32245* (2013.01); *H01L 2224/48245* (2013.01); *H01L 2224/73215* (2013.01); *H01L 2224/73265* (2013.01); *H01L 2924/12036* (2013.01); *H01L 2924/13055* (2013.01); *H01L 2924/13091* (2013.01); *H10D 30/668* (2025.01)

(58) Field of Classification Search
CPC . H01L 2224/32058; H01L 2224/32245; H01L 2224/48245; H01L 2224/73215; H01L 2224/73265; H01L 2924/12036; H01L 2924/13055; H01L 2924/13091; H01L 23/49541; H01L 23/49562; H01L 23/49568; H01L 23/367; H10D 30/668; H10D 8/00; H10D 12/481; H10D 64/232
USPC ........................................................ 257/786
See application file for complete search history.

(56) References Cited

U.S. PATENT DOCUMENTS

| | | | | |
|---|---|---|---|---|
| 7,847,391 | B2* | 12/2010 | Udompanyavit | H01L 23/495 257/143 |
| 8,018,008 | B2* | 9/2011 | Ozoe | H01L 25/074 257/341 |
| 9,666,501 | B2* | 5/2017 | Haga | H01L 23/49548 |
| 10,593,788 | B2* | 3/2020 | Lau | H10D 62/10 |
| 10,672,761 | B2* | 6/2020 | Yoshida | H10D 64/519 |
| 11,145,644 | B2* | 10/2021 | Hosoya | H10D 64/62 |
| 2007/0215980 | A1 | 9/2007 | Otremba | |
| 2013/0320454 | A1 | 12/2013 | Suzuki | |
| 2014/0015007 | A1* | 1/2014 | Werber | H10D 12/481 257/142 |
| 2015/0060943 | A1 | 3/2015 | Motonobu | |
| 2016/0225891 | A1 | 8/2016 | Hiyoshi | |
| 2017/0352603 | A1 | 12/2017 | Ichiryu | |
| 2021/0005713 | A1 | 1/2021 | Kawano | |

FOREIGN PATENT DOCUMENTS

| | | |
|---|---|---|
| JP | 2853692 B2 | 2/1999 |
| JP | 2007048889 A | 2/2007 |
| JP | 2009141067 A | 6/2009 |
| JP | 4704084 B2 | 6/2011 |
| JP | 2013247309 A | 12/2013 |
| JP | 2015046599 A | 3/2015 |
| JP | 2015056543 A | 3/2015 |
| JP | 2019134076 A | 8/2019 |
| JP | 2020068331 A | 4/2020 |
| JP | 2021009944 A | 1/2021 |
| JP | 6868455 B2 | 5/2021 |
| JP | 6938966 B2 | 9/2021 |
| JP | 2021158180 A | 10/2021 |

OTHER PUBLICATIONS

Japanese Office Action dated Jun. 11, 2025, mailed in counterpart Japanese Application No. 2022-121506, 12 pages.
Japanese Office Action dated Nov. 5, 2025, mailed in counterpart Japanese Application No. 2022-121506, 10 pages.

* cited by examiner

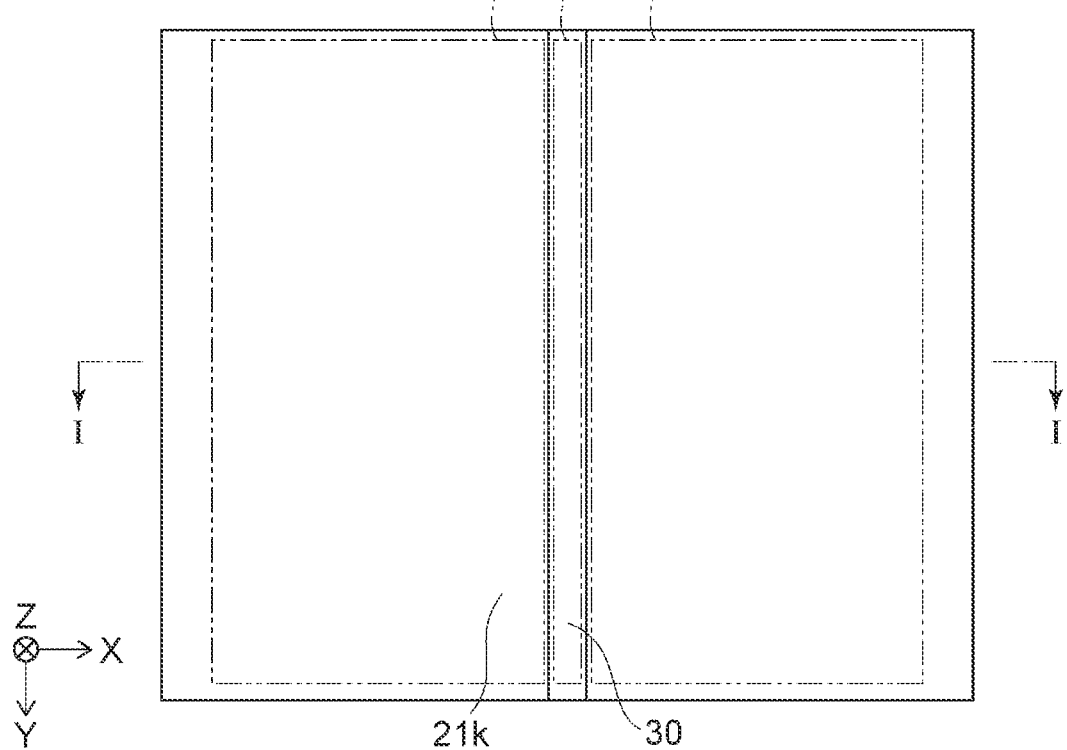
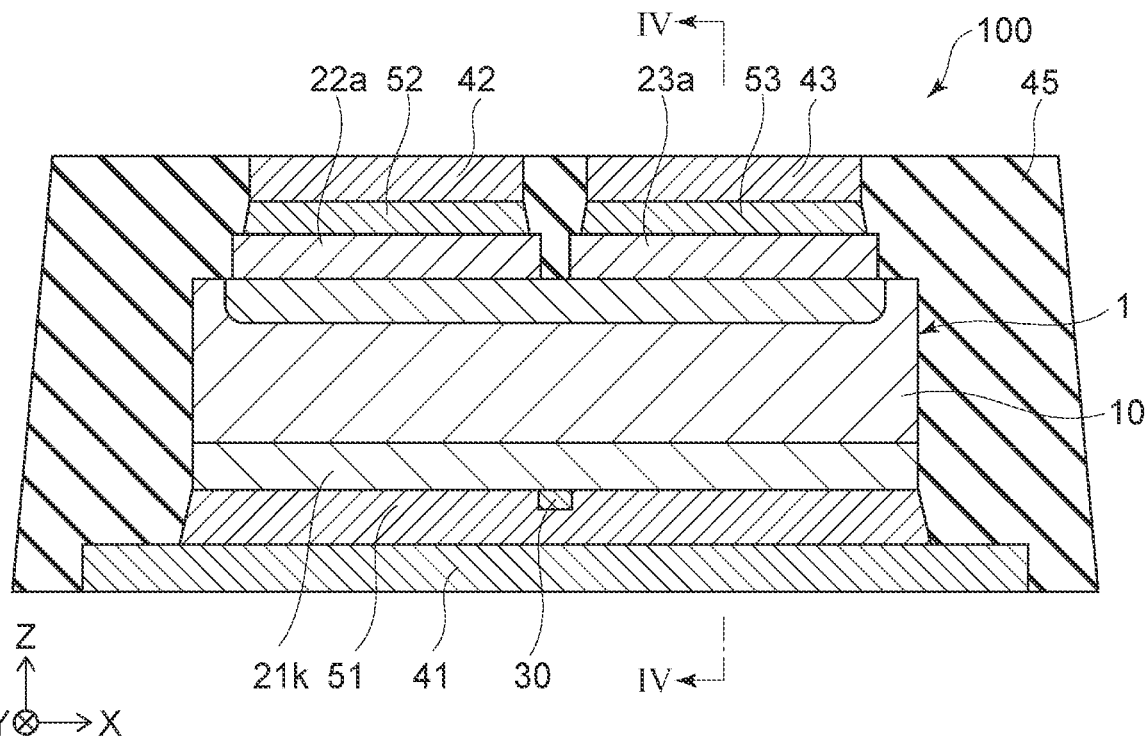

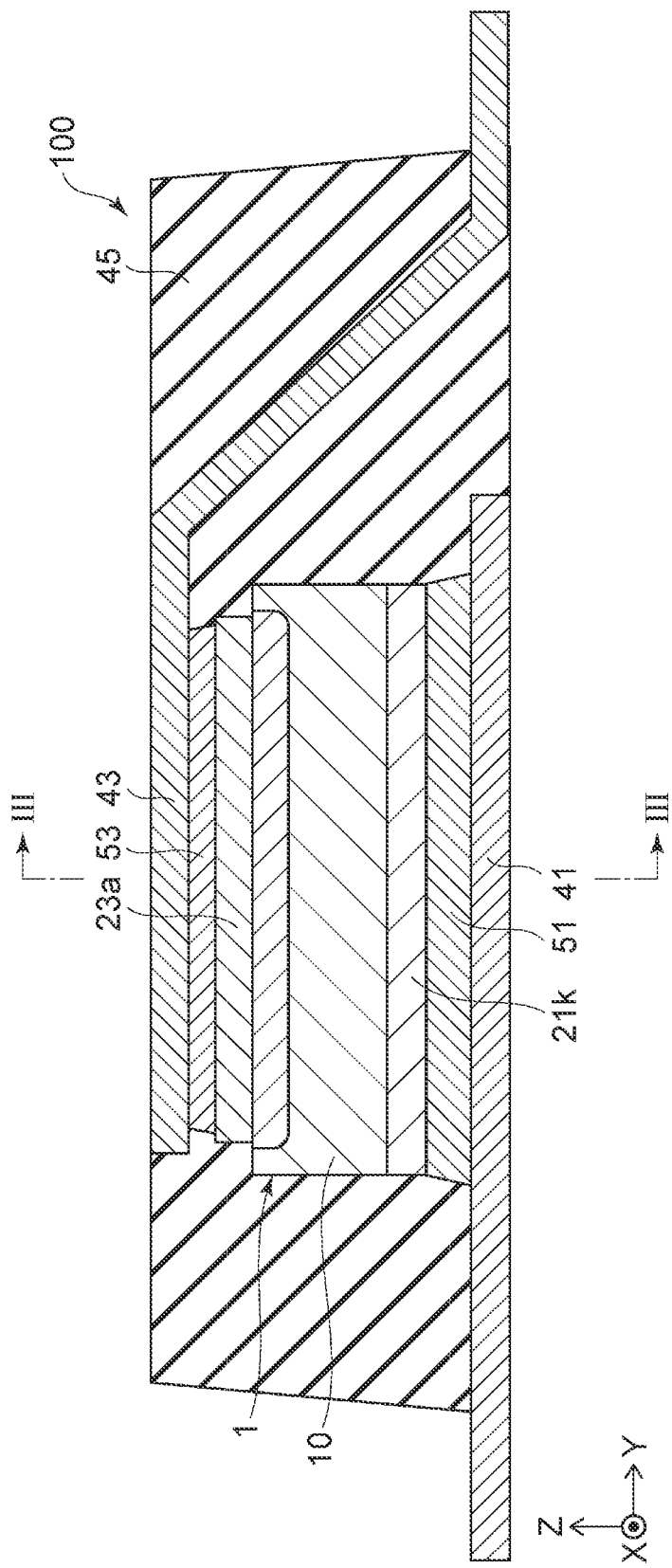

SEMICONDUCTOR CHIP AND SEMICONDUCTOR DEVICE

CROSS-REFERENCE TO RELATED APPLICATION(S)

This application is based upon and claims the benefit of priority from Japanese Patent Application No. 2022-121506, filed Jul. 29, 2022, the entire contents of which are incorporated herein by reference.

FIELD

Embodiments described herein relate generally to a semiconductor chip and a semiconductor device.

BACKGROUND

Semiconductor chips including elements as a diode, a metal oxide semiconductor field effect transistor (MOSFET), and an insulated gate bipolar transistor (IGBT) can be used for purposes of power conversion. In such semiconductor chips, it is desirable that thermal runaway be unlikely to occur.

BRIEF DESCRIPTION OF THE DRAWINGS

FIG. 2B is a bottom view illustrating a semiconductor chip according to a first embodiment.

FIG. 3 is a cross-sectional view illustrating a semiconductor device according to a first embodiment.

FIG. 4 is a cross-sectional view illustrating a semiconductor device according to a first embodiment.

DETAILED DESCRIPTION

Figure 1:
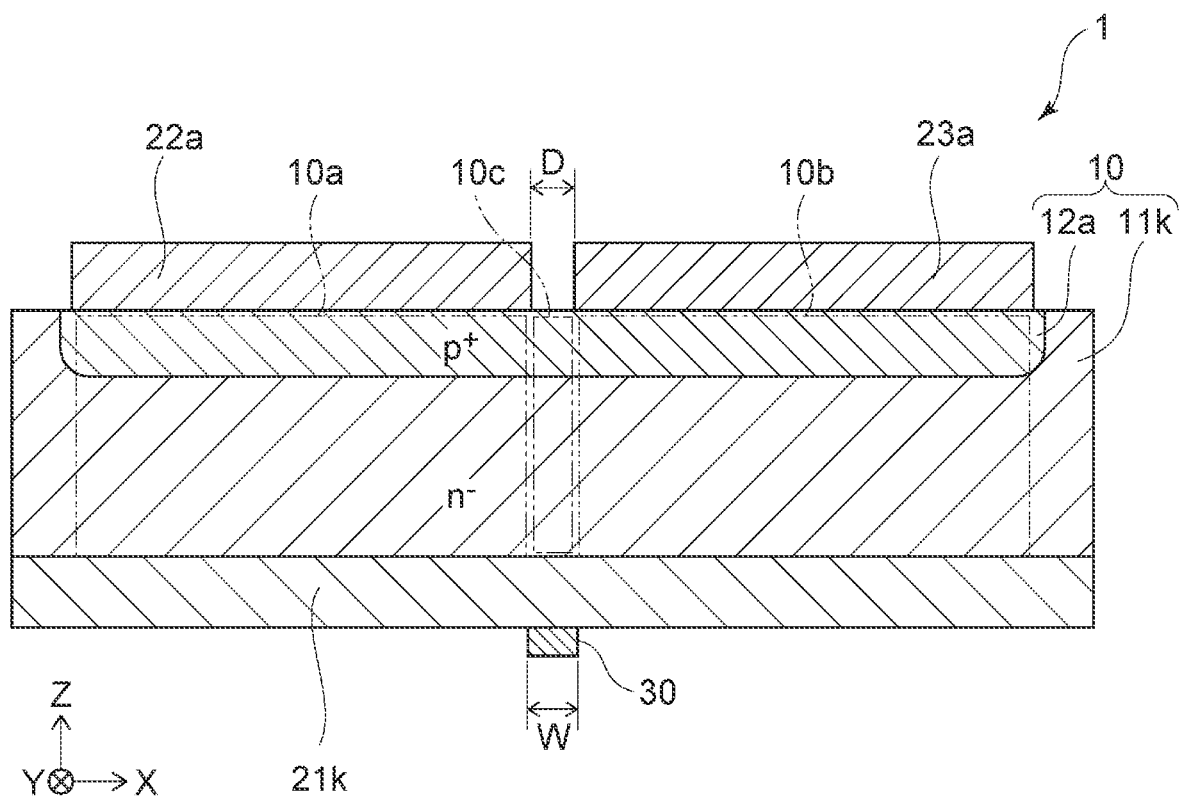
FIG. 1 is a cross-sectional view illustrating a semiconductor chip according to a first embodiment.

Embodiments provide a semiconductor chip and a semiconductor device each of which is capable of preventing or reducing the occurrence of a thermal runaway event.

In general, according to one embodiment, a semiconductor chip includes a first electrode and a semiconductor layer on a first side of the first electrode. A second electrode is on a first portion of the semiconductor layer that is between the first electrode and the second electrode in a first direction. A third electrode is on a second portion of the semiconductor layer that is between the first electrode and the third electrode in the first direction. A metallic layer is on a second side of the first electrode. The metallic layer is aligned with a third portion of the semiconductor layer in the first direction. The third portion of the semiconductor layer is between the first and second portions in a second direction perpendicular to the first direction.

Certain example embodiments of the present disclosure will be described below with reference to the drawings.

Furthermore, the drawings are merely schematic or conceptual, and thus depicted relationships between thickness and width of each portion and/or ratios in dimensions between the depicted portions are not necessarily the same as those actual examples. Moreover, even when the same components or the like are represented in different, the dimension relationship or ratio between the respective components may be represented in different manners depending on the drawing.

Moreover, in the present specification and figures, elements substantially similar to those described previously are assigned the respective same reference symbols and the description thereof may be omitted as appropriate.

In the following, notations $n^+$, n, and $n^-$ and notations $p^+$ and p represent the relative concentration level of different dopant (impurity) types (n-type or p-type). The notation with "+" appended thereto indicates that the impurity concentration is relatively high, and the notation with "−" appended thereto indicates that the impurity concentration is relatively low. When both a p-type impurity and an n-type impurity are contained in the same region, these notations represent the relative highness and lowness of a net impurity concentration obtained by the p-type impurity and the n-type impurity compensating (offsetting) for each other.

For each example embodiment described below, p-type semiconductor regions and n-type semiconductor regions may be switched with each other to implement another embodiment substantially similar to the example embodiments excepting for the impurity types.

First Embodiment

Figure 2A:
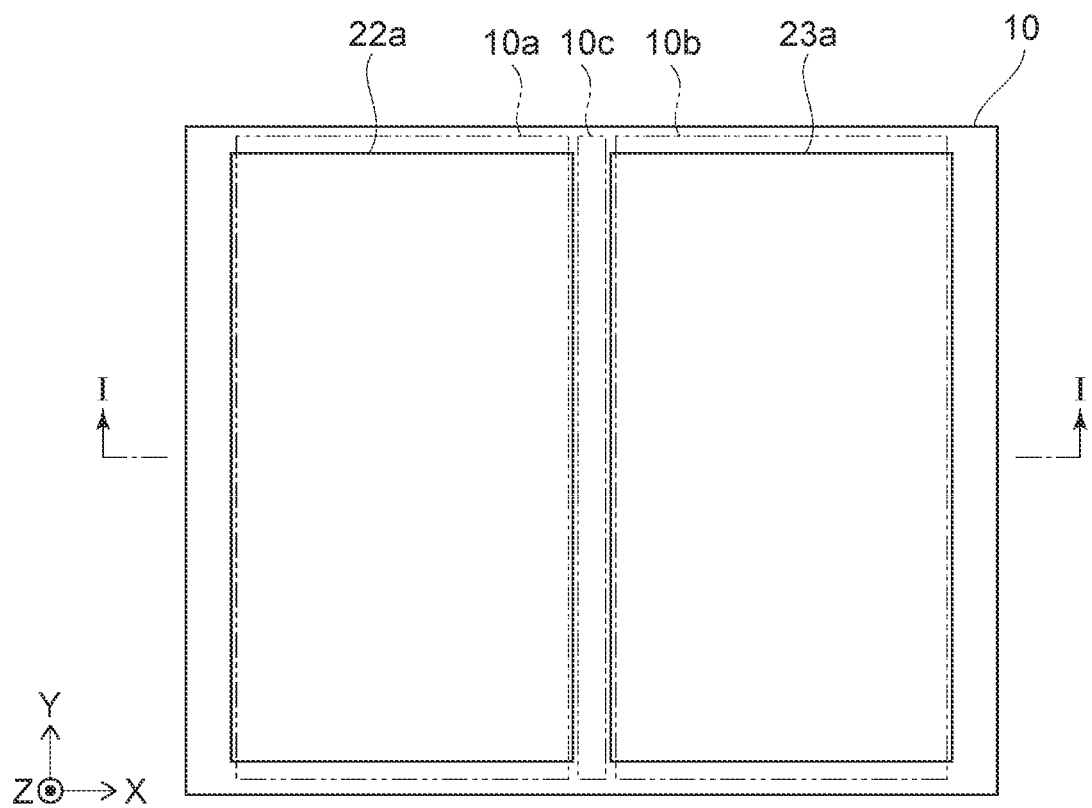
FIG. 2A is a top view illustrating a semiconductor chip according to a first embodiment.

FIG. 1 is a cross-sectional view illustrating a semiconductor chip according to a first embodiment. FIG. 2A is a top view illustrating the semiconductor chip according to the first embodiment. FIG. 2B is a bottom view illustrating the semiconductor chip according to the first embodiment. FIG. 1 is the cross-sectional view taken along lune I-I illustrated in FIG. 2A and FIG. 2B.

The semiconductor chip 1 according to the first embodiment is a diode. As illustrated in FIG. 1, FIG. 2A, and FIG. 2B, the semiconductor chip 1 according to the first embodiment includes a semiconductor layer 10, a cathode electrode

21k (a first electrode), an anode electrode 22a (a second electrode), an anode electrode 23a (a third electrode), and a metallic layer 30.

In the description of each embodiment, an XYZ orthogonal coordinate system is used for explanatory convenience. The direction leading from the cathode electrode 21k to the semiconductor layer 10 is set to be a Z-direction. One direction perpendicular to the Z-direction is set to be an X-direction. One direction perpendicular to the X-direction and the Z-direction is set to be a Y-direction. In the description, the direction leading from the cathode electrode 21k to the semiconductor layer 10 is referred to as "over, above, upper, or upward" direction or the like, and a direction opposite to such direction is referred to as "under, below, lower, or downward" direction or the like. These directions are directions that are based on a relative positional relationship between the cathode electrode 21k and the semiconductor layer 10, and need not have any relation to the direction of gravitational force.

As illustrated in FIG. 1, the cathode electrode 21k is provided at a lower surface side of the semiconductor chip 1. The semiconductor layer 10 is provided over the cathode electrode 21k. The semiconductor layer 10 includes a first portion 10a, a second portion 10b, and a third portion 10c. In FIG. 1, the portions are indicated by two-dot chain lines. The third portion 10c is located between the first portion 10a and the second portion 10b. A direction leading from the first portion 10a to the second portion 10b is perpendicular to the Z-direction. In the illustrated example, the direction leading from the first portion 10a to the second portion 10b is parallel to the X-direction.

As illustrated in FIG. 1 and FIG. 2A, the anode electrode 22a and the anode electrode 23a are provided over the first portion 10a and over the second portion 10b, respectively. The anode electrode 22a and the anode electrode 23a are separated from each other.

As illustrated in FIG. 1, the semiconductor layer 10 includes an n$^-$-type cathode region 11k (a first semiconductor region of a first conductivity type) and a p$^+$-type anode region 12a (a second semiconductor region of a second conductivity type). The n$^-$-type cathode region 11k and the p$^+$-type anode region 12a span the first portion 10a, the third portion 10c, and the second portion 10b. The n$^-$-type cathode region 11k is electrically connected to the cathode electrode 21k. The p$^-$-type anode region 12a is provided over a part of the n$^-$-type cathode region 11k and is electrically connected to the anode electrode 22a and the anode electrode 23a. In some examples, a plurality of p$^+$-type anode regions 12a spaced from each other may be provided under the anode electrode 22a and under the anode electrode 23a.

As illustrated in FIG. 1 and FIG. 2B, the metallic layer 30 is provided under the cathode electrode 21k and is located below the third portion 10c. The metallic layer 30 is in contact with the cathode electrode 21k and is electrically connected to the cathode electrode 21k. The lower surface of the metallic layer 30 is located below the lower surface of the cathode electrode 21k. Thus, the metallic layer 30 is protruded downward from the cathode electrode 21k. The metallic layer 30 and a gap between the anode electrode 22a and the anode electrode 23a are aligned with each other in the Z-direction.

A p-n junction is formed between the n$^-$-type cathode region 11k and the p$^+$-type anode region 12a. When a positive voltage is applied to the anode electrode 22a or the anode electrode 23a with respect to the cathode electrode 21k, a current flows through the semiconductor chip 1. When a positive voltage is applied to the cathode electrode 21k with respect to the anode electrode 22a or the anode electrode 23a, the current stops flowing, so that a depletion layer spreads from the p-n junction to the n$^-$-type cathode region 11k and the p$^+$-type anode region 12a.

FIG. 3 and FIG. 4 are cross-sectional views illustrating a semiconductor device according to the first embodiment. FIG. 3 is equivalent to a cross-sectional view taken along line III-III in FIG. 4. FIG. 4 is equivalent to a cross-sectional view taken along line IV-IV in FIG. 3.

As illustrated in FIG. 3 and FIG. 4, the semiconductor device 100 according to the first embodiment includes the semiconductor chip 1, a lead frame 41 (a first metallic member), a lead frame 42 (a second metallic member), a lead frame 43 (a third metallic member), an insulating member 45, a junction layer 51 (a first junction layer), a junction layer 52 (a second junction layer), and a junction layer 53 (a third junction layer).

The semiconductor chip 1 is joined to the upper surface of the lead frame 41 via the junction layer 51. The cathode electrode 21k and the metallic layer 30 of the semiconductor chip 1 are electrically connected to the lead frame 41. The upper surface of the lead frame 41 is substantially flat along the X-Y plane. Therefore, the distance between the lead frame 41 and the metallic layer 30 is shorter than the distance between the lead frame 41 and the cathode electrode 21k.

The lead frame 42 is joined to the upper of the anode electrode 22a via the junction layer 52 and is electrically connected to the anode electrode 22a. The lead frame 43 is joined to the upper surface the anode electrode 23a via the junction layer 53 and is electrically connected to the anode electrode 23a. The lead frame 43 is separated from the lead frame 42. Alternatively, a single lead frame may be provided above both the anode electrode 22a and the anode electrode 23a. In that case, the anode electrode 22a and the anode electrode 23a are electrically connected to the single lead frame via the junction layers 52 and 53, respectively.

The insulating member 45 is provided surrounding the semiconductor chip 1 and functions to seal (encapsulate) the semiconductor chip 1. As illustrated in FIG. 4, a part of each lead frame is left externally exposed (that is, not covered by the insulating member 45). As illustrated in FIG. 4, the lower surface of the lead frame 41, the upper surface of the lead frame 42, and the upper surface of the lead frame 43 are left uncovered by the insulating member 45.

An example of a material for each element will be described.

The semiconductor layer 10 includes a semiconductor material. The semiconductor material is, for example, silicon, silicon carbide, gallium nitride, or gallium arsenide. In a case where silicon is used as the semiconductor material, arsenic, phosphorus, or antimony may be used as an n-type impurity. Boron may be used as a p-type impurity.

Each of the cathode electrode 21k, the anode electrode 22a, and the anode electrode 23a comprises a metal such as titanium, aluminum, or copper. The metallic layer 30 may be a variety of different metal and/or an alloy of different metals. To increase the thermal conductivity of the metallic layer 30, it is favorable that the metallic layer 30 includes one or more of silver and copper. The metallic layer 30 can be formed by, for example, a plating process. Each of the lead frames 41 to 43 comprises a metal such as copper. The insulating member 45 can be an insulating resin such as polyimide. Each of the junction layers 51 to 53 includes solder containing, for example, tin. It is favorable that lead-free solder is used as the solder. The solder of some examples may include, in addition to tin, silver or copper.

Advantages of the first embodiment are described.

With regard to the semiconductor chip 1 according to an embodiment, respective external electrical circuits can be connected to the anode electrodes 22a and 23a. For example, with respect to an electrical circuit in which two rectifying diodes are used, one semiconductor chip 1 may be used as two rectifying diodes. Moreover, when the semiconductor chip 1 is used as a protection diode for electrostatic discharge protection, each of a plurality of electrical circuits can be protected by one semiconductor chip 1. Alternatively, providing multiple $p^+$-type anode regions 12a separated from each other under the anode electrodes 22a and 23a, enables the semiconductor chip 1 to be used as a bidirectional diode.

During operation of the semiconductor chip 1, when a current flows from the anode electrode 22a or the anode electrode 23a to the cathode electrode 21k, heat is generated at the semiconductor layer 10. The heat generated at the semiconductor layer 10 transfers to the cathode electrode 21k, the anode electrode 22a, and/or the anode electrode 23a and is then discharged from the semiconductor chip 1. The heat discharged from the semiconductor chip 1 thus transfers to the lead frames 41, 42, 43 to 43 and is then discharged from the semiconductor device 100.

In the semiconductor chip 1, the first portion 10a is located under the anode electrode 22a and the second portion 10b is located under the anode electrode 23a. Therefore, heat generated at the first portion 10a and heat generated at the second portion 10b can be efficiently discharged via the anode electrode 22a and the anode electrode 23a, respectively. However, the third portion 10c is located under a gap between the anode electrode 22a and the anode electrode 23a. Therefore, heat generated at the third portion 10c is less able to be discharged from the semiconductor layer 10 as compared with heat generated at the first portion 10a or the second portion 10b.

When the temperature of some part of the semiconductor layer 10 increases, the electrical resistance of that part decreases. Due to the decrease in electrical resistance, more current flows through that part, so that heat is further generated. Since increase in heat generation produces a decrease in electrical resistance, the semiconductor chip 1 may eventually be finally broken by an event called a "thermal runaway." When the temperature of the third portion 10c increases, a thermal runaway may begin to occur at the third portion 10c, so that there is a possibility the semiconductor chip 1 is eventually broken if the heat of the third portion 10c cannot be removed sufficiently.

Figure 5A:
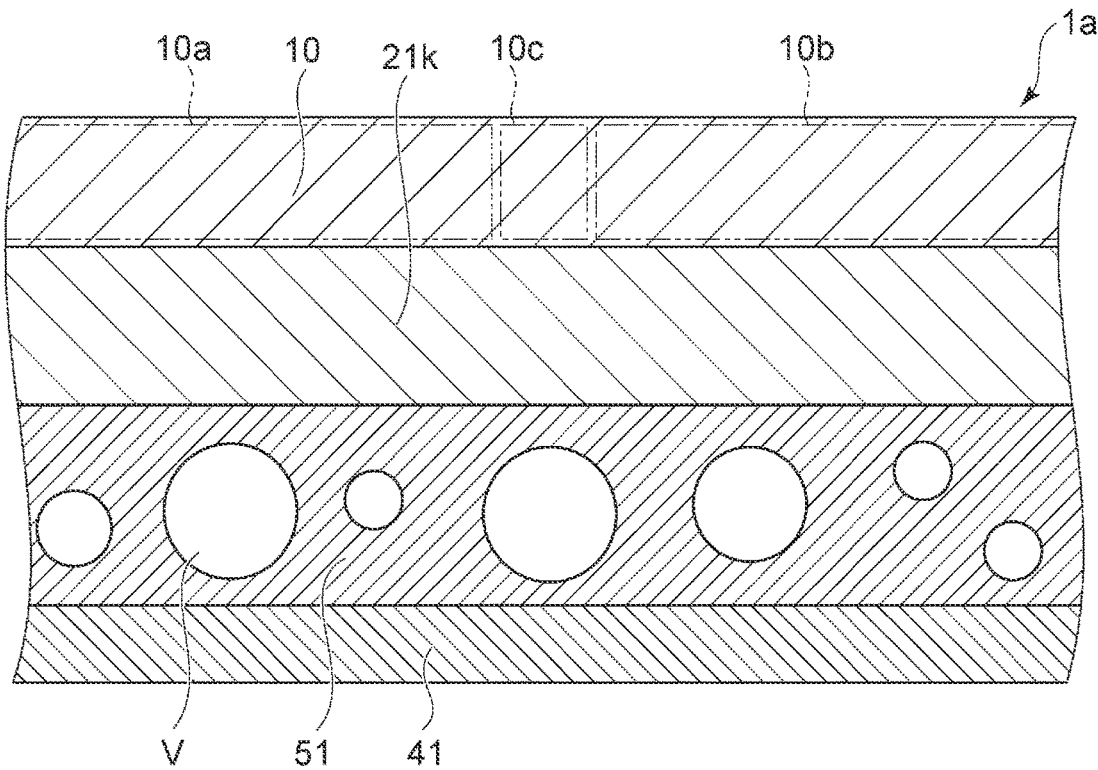
FIG. 5A is a cross-sectional view illustrating a semiconductor device including a semiconductor chip according to a reference example.
Figure 5B:
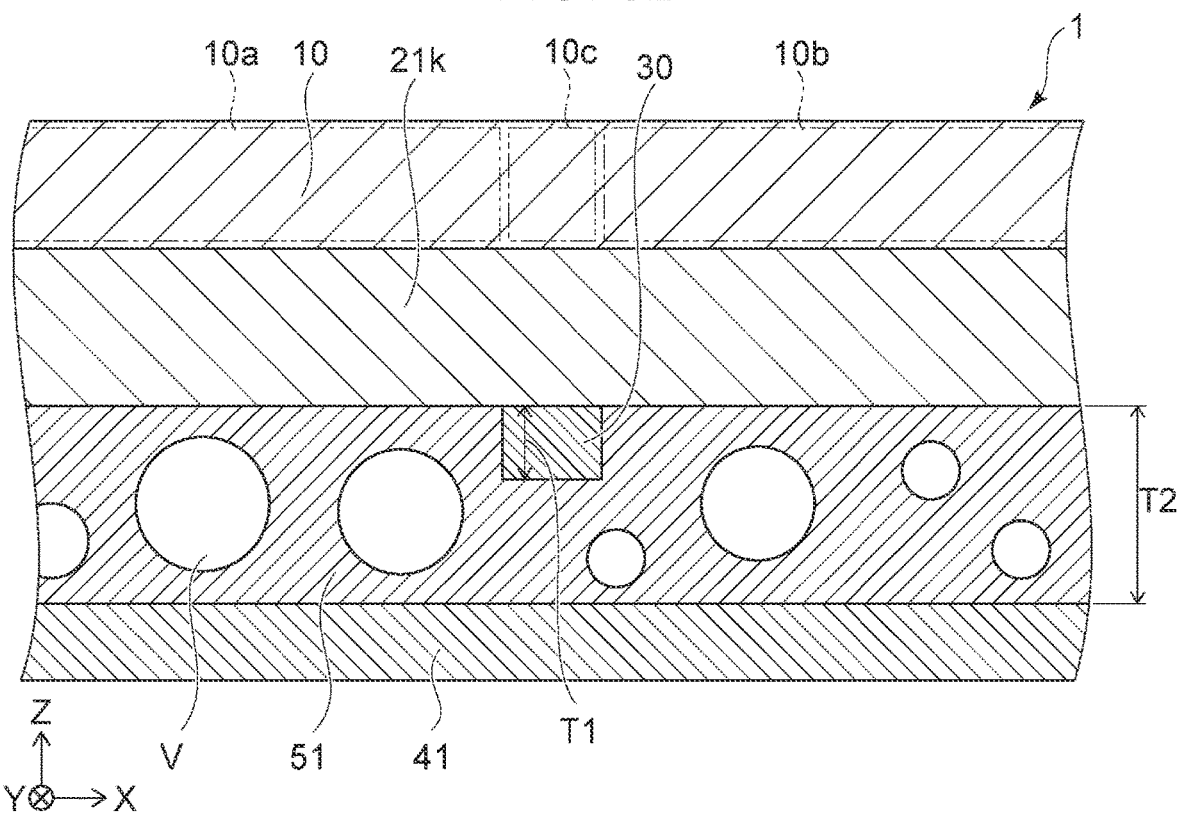
FIG. 5B is a cross-sectional view illustrating a semiconductor device including a semiconductor chip according to an embodiment.

FIG. 5A is a cross-sectional view illustrating a semiconductor device including a semiconductor chip according to a reference example. FIG. 5B is a cross-sectional view illustrating a semiconductor device including a semiconductor chip according to an embodiment.

The semiconductor chip 1a according to the reference example illustrated in FIG. 5A does not include the metallic layer 30. Also, in the junction layer 51, a plurality of voids V exists. The void V occurs due to, for example, bubbles entrained in a solder paste serving as a material of the junction layer 51 being incorporated inadvertently and unavoidably. The thermal conductivity of the void V is significantly lower than the thermal conductivity of surrounding the junction layer 51 material itself. Therefore, if the void V exists, discharging of heat from the semiconductor layer 10 may be reduced. Particularly, if a void V exists directly below the third portion 10c, the discharging of heat from the third portion 10c can be reduced, so that the temperature of the third portion 10c becomes more likely to increase.

The semiconductor chip 1 according to an embodiment includes the metallic layer 30. The metallic layer 30 is provided under the cathode electrode 21k and is located directly below the third portion 10c. Since the metallic layer 30 is being provided, when the semiconductor chip 1 is mounted above the lead frame 41, voids V from the solder paste will generally be laterally pushed out from or crushed by the metallic layer 30. Providing the metallic layer 30 causes the number and/or volume of voids V contained in the junction layer 51 (at least directly below the third portion 10c) to decrease, as illustrated in FIG. 5B. As a result, heat becomes easier to be discharged from the third portion 10c through the metallic layer 30 and the junction layer 51, so that thermal runaway in the semiconductor chip 1 can be prevented or reduced.

In the example illustrated in FIG. 5B, a part of the junction layer 51 is located between the lead frame 41 and the metallic layer 30 in the Z-direction. A different part of the junction layer 51 is not located between the lead frame 41 and the metallic layer in the Z-direction. In general, density of voids V in the part of the junction layer 51 under the metallic layer 30 will be lower than the density of voids V in the other parts of the junction layer 51.

As the metallic layer 30 becomes thicker (Z dimension increases), the density of voids V below the third portion 10c becomes even lower and heat becomes even better able to be discharged from the third portion 10c. On the other hand, when the metallic layer 30 becomes too thick, the semiconductor chip 1 will become unstable when being mounted on the lead frame 41. Therefore, as illustrated in FIG. 5B, it is favorable that the thickness T1 of the metallic layer 30 is in a range of 0.1 to 0.5 times the thickness T2 of the junction layer 51.

From the viewpoint of the stability of the semiconductor chip 1 for mounting purposes, the effect of decreasing the density of voids V, and the property of heat discharge by the metallic layer 30, the thickness T1 of the metallic layer 30 is preferably in a range of 0.1 times to 0.2 times the thickness T2 of the junction layer 51. When the metallic layer 30 comprises one or more of copper and silver, it is possible to make the thermal conductivity of the metallic layer 30 substantially greater than the thermal conductivity of the junction layer 51. Thus, even when the effect of decreasing the density of voids V provided by the metallic layer 30 is small, it is possible to facilitate discharging of heat from the third portion 10c through the metallic layer 30 and prevent or reduce thermal runaway in the semiconductor chip 1.

In some examples, portions of the metallic layer 30 may be provided below a part of the first portion 10a and/or below a part of the second portion 10b. The metallic layer 30 can be below some but not all of the first portion 10a and the second portion 10b. As the width W of the metallic layer 30 (X dimension illustrated in FIG. 1) becomes larger, the thermal conductivity from the third portion 10c to the lead frame 41 increases.

On the other hand, if the width W is too small or too large, at the time of mounting of the semiconductor chip 1, the effect of laterally pushing out voids V tends to decrease. Therefore, it is generally favorable that the width W dimension is 0.5 times to 2.0 times the distance D (gap size) between the anode electrode 22a and the anode electrode 23a. The distance D corresponds to the width of the third portion 10c.

Moreover, it is generally favorable that the metallic layer 30 extends to the edge surfaces of the semiconductor chip 1, as illustrated in FIG. 2B. In the illustrated example, the positions of the outer edge surfaces of the metallic layer 30 are identical to the positions of the outer edge surfaces of the semiconductor chip 1. The metallic layer 30 extending to the edge surfaces of the semiconductor chip 1 enables pushing out the voids V to the ends to the junction layer 51 when the semiconductor chip 1 is joined to the lead frame 41. Bubbles contained (ultimately forming the voids V) are discharged to the outside of the junction layer 51, so that the voids V are eliminated or reduced. Thus, it is possible to decrease the density of voids V in the junction layer 51 and further prevent or reduce thermal runaway in the semiconductor chip 1.

Second Embodiment

Figure 6:
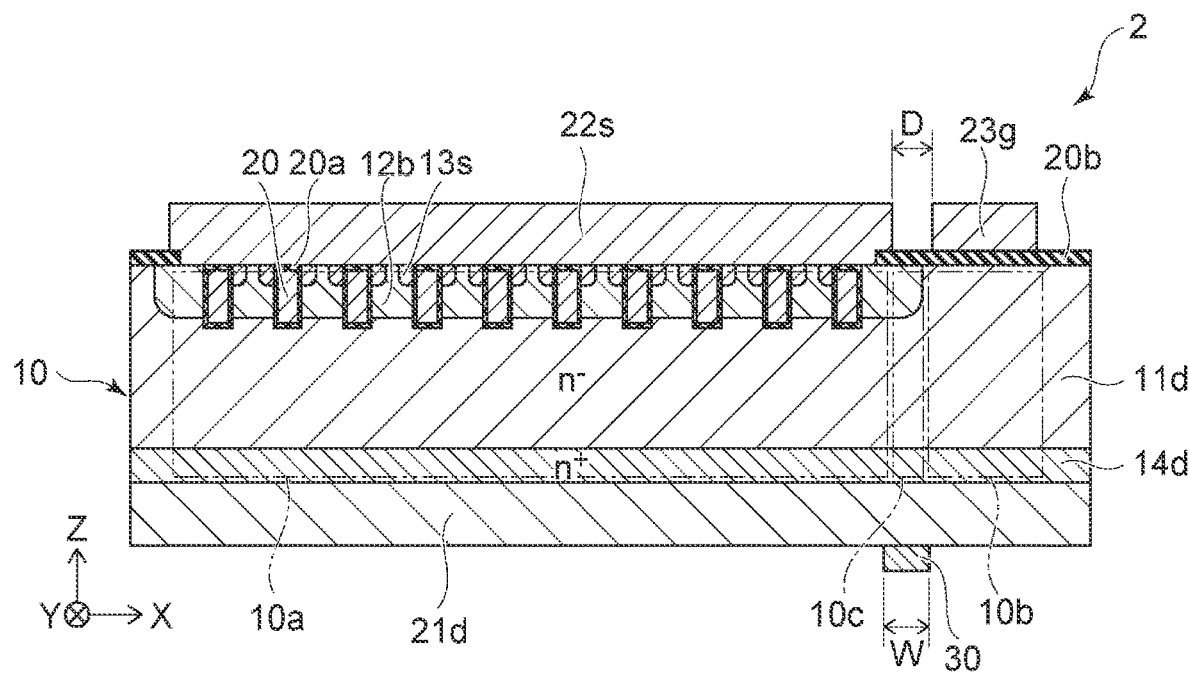
FIG. 6 is a cross-sectional view illustrating a semiconductor chip according to a second embodiment.
Figure 7A:
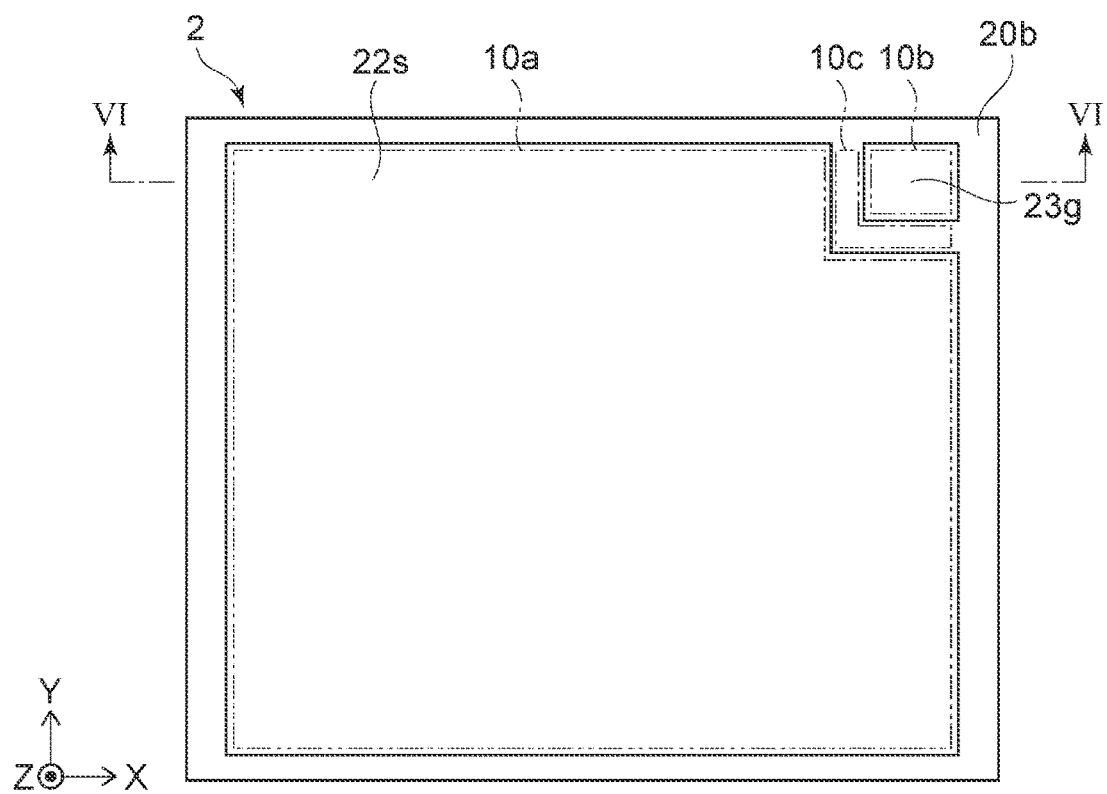
FIG. 7A is a top view illustrating a semiconductor chip according to a second embodiment.
Figure 7B:
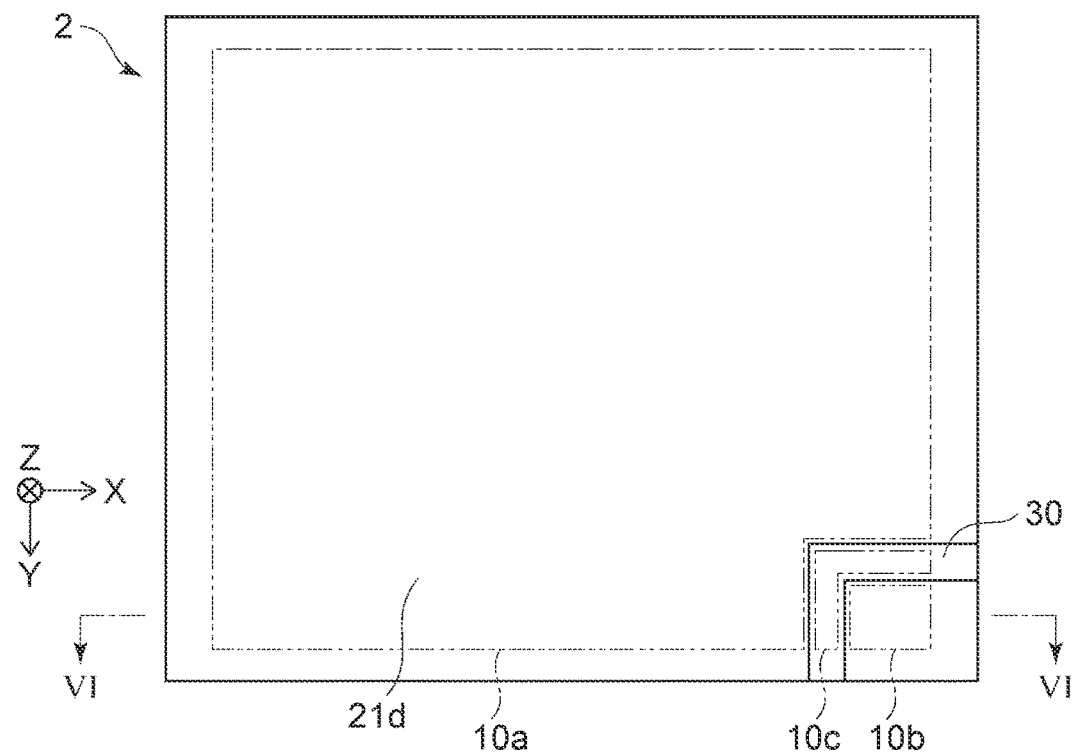
FIG. 7B is a bottom view illustrating a semiconductor chip according to a second embodiment.

FIG. 6 is a cross-sectional view illustrating a semiconductor chip according to a second embodiment. FIG. 7A is a top view illustrating the semiconductor chip according to the second embodiment. FIG. 7B is a bottom view illustrating the semiconductor chip according to the second embodiment. FIG. 6 is equivalent to cross-sectional views taken along line VI-VI in FIG. 7A and FIG. 7B.

The semiconductor chip 2 according to the second embodiment is an MOSFET. As illustrated in FIG. 6, FIG. 7A, and FIG. 7B, the semiconductor chip 2 according to the second embodiment includes a semiconductor layer 10, a gate electrode 20, a drain electrode 21d (a first electrode), a source electrode 22s (a second electrode), a gate pad 23g (a third electrode), and a metallic layer 30.

As illustrated in FIG. 6, the drain electrode 21d is provided at the lower surface side of the semiconductor chip 2. The semiconductor layer 10 is provided over the drain electrode 21d. As with the semiconductor chip 1, in the semiconductor chip 2, the semiconductor layer 10 includes a first portion 10a, a second portion 10b, and a third portion 10c.

As illustrated in FIG. 6 and FIG. 7A, the source electrode 22s is provided over the first portion 10a and the gate pad 23g is over the second portion 10b. The source electrode 22s and the gate pad 23g are separated from each other. As illustrated in FIG. 6 and FIG. 7B, the metallic layer 30 is provided under the drain electrode 21d and is below the third portion 10c. The metallic layer 30 and a gap between the source electrode 22s and the gate pad 23g are aligned in the Z-direction.

The semiconductor layer 10 of this example includes an n$^-$-type drift region 11d (a first semiconductor region), a p-type base region 12b (a second semiconductor region), an n$^+$-type source region 13s (a third semiconductor region), and an n$^+$-type drift region 14d. The n$^+$-type drift region 14d is provided over the drain electrode 21d and is electrically connected to the drain electrode 21d. The n$^-$-type drift region 11d is provided over the n$^+$-type drift region 14d. The n$^-$-type drift region 11d is electrically connected to the drain electrode 21d via the n$^+$-type drift region 14d. The n$^-$-type drift region 11d and the n$^+$-type drift region 14d are provided in the first portion 10a, the second portion 10b, and the third portion 10c.

The p-type base region 12b is provided over the n$^-$-type drift region 11d in the first portion 10a and the third portion 10c. The n$^+$-type source region 13s is provided over the p-type base region 12b in the first portion 10a. The gate electrode 20 faces the p-type base region 12b via a gate insulating layer 20a.

The source electrode 22s is electrically connected to the p-type base region 12b and the n$^+$-type source region 13s. The gate insulating layer 20a is provided between the gate electrode 20 and the source electrode 22s. The gate electrode 20 and the source electrode 22s are electrically separated from each other. The gate pad 23g is electrically connected to the gate electrode 20. An insulating layer 20b is provided between the semiconductor layer 10 and the gate pad 23g. The semiconductor layer 10 and the gate pad 23g are electrically separated from each other.

The p-type base regions 12b, the n$^+$-type source regions 13s, and the gate electrodes 20 extend in the Y-direction, and are arranged (spaced) in the X-direction. The source electrode 22s is electrically connected to a plurality of p-type base regions 12b and a plurality of n$^+$-type source regions 13s. The gate pad 23g is electrically connected to a plurality of gate electrodes 20.

In the illustrated example, the semiconductor chip 2 has a trench gate structure in which the gate electrode 20 is surrounded by the semiconductor layer 10 in an X-Y plane. In other examples, semiconductor chip 2 may have a planar gate structure in which the gate electrode 20 is provided above the semiconductor layer 10. With either gate structure, the gate electrode 20 is located between the semiconductor layer 10 and the source electrode 22s in the Z direction.

If a positive voltage is applied to the drain electrode 21d with respect to the source electrode 22s and a voltage higher than or equal to a threshold value is applied to the gate electrode 20 a channel (an inversion layer) is formed in the p-type base region 12b, so that the semiconductor chip 2 enters into an on-state. Electrons pass through the channel and flow from the source electrode 22s to the drain electrode 21d. When the voltage which is applied to the gate electrode 20 becomes lower than the threshold value, the channel in the p-type base region 12b disappears, so that the semiconductor chip 2 enters into an off-state.

Figure 8:
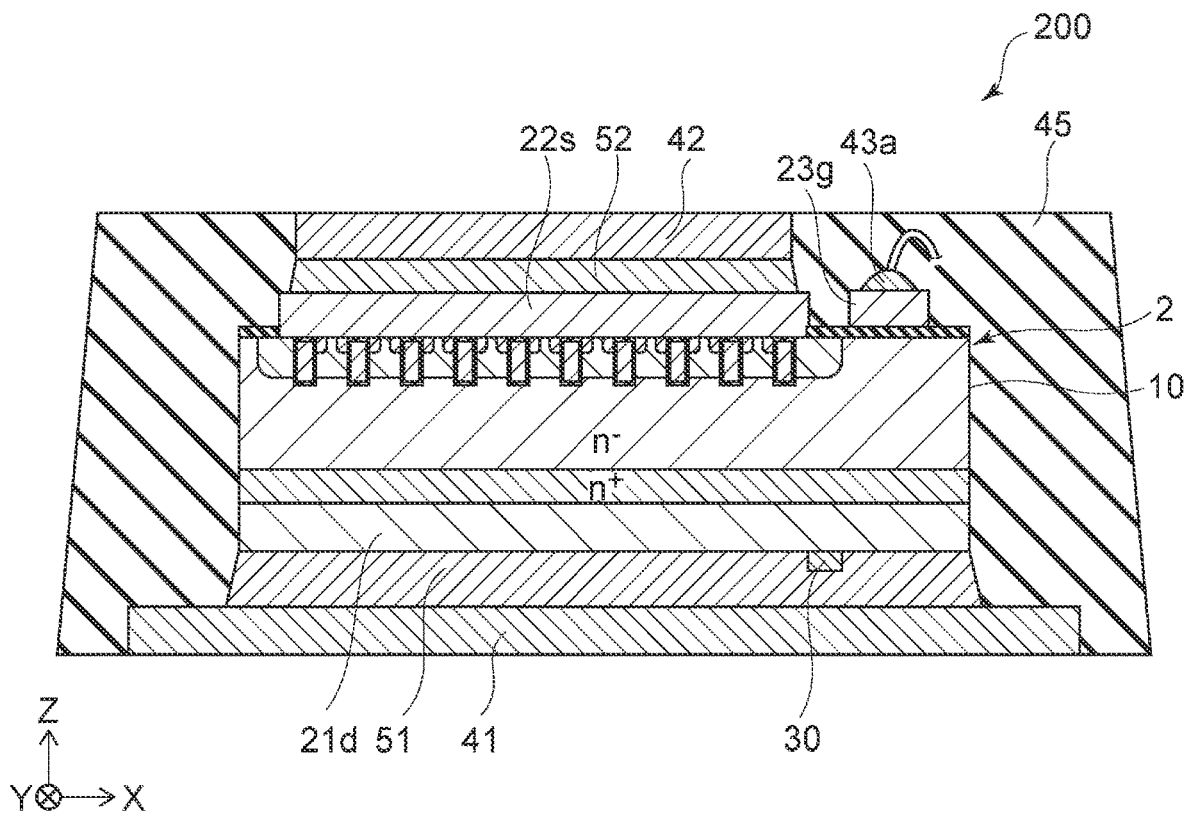
FIG. 8 is a cross-sectional view illustrating a semiconductor device according to a second embodiment.
Figure 9:
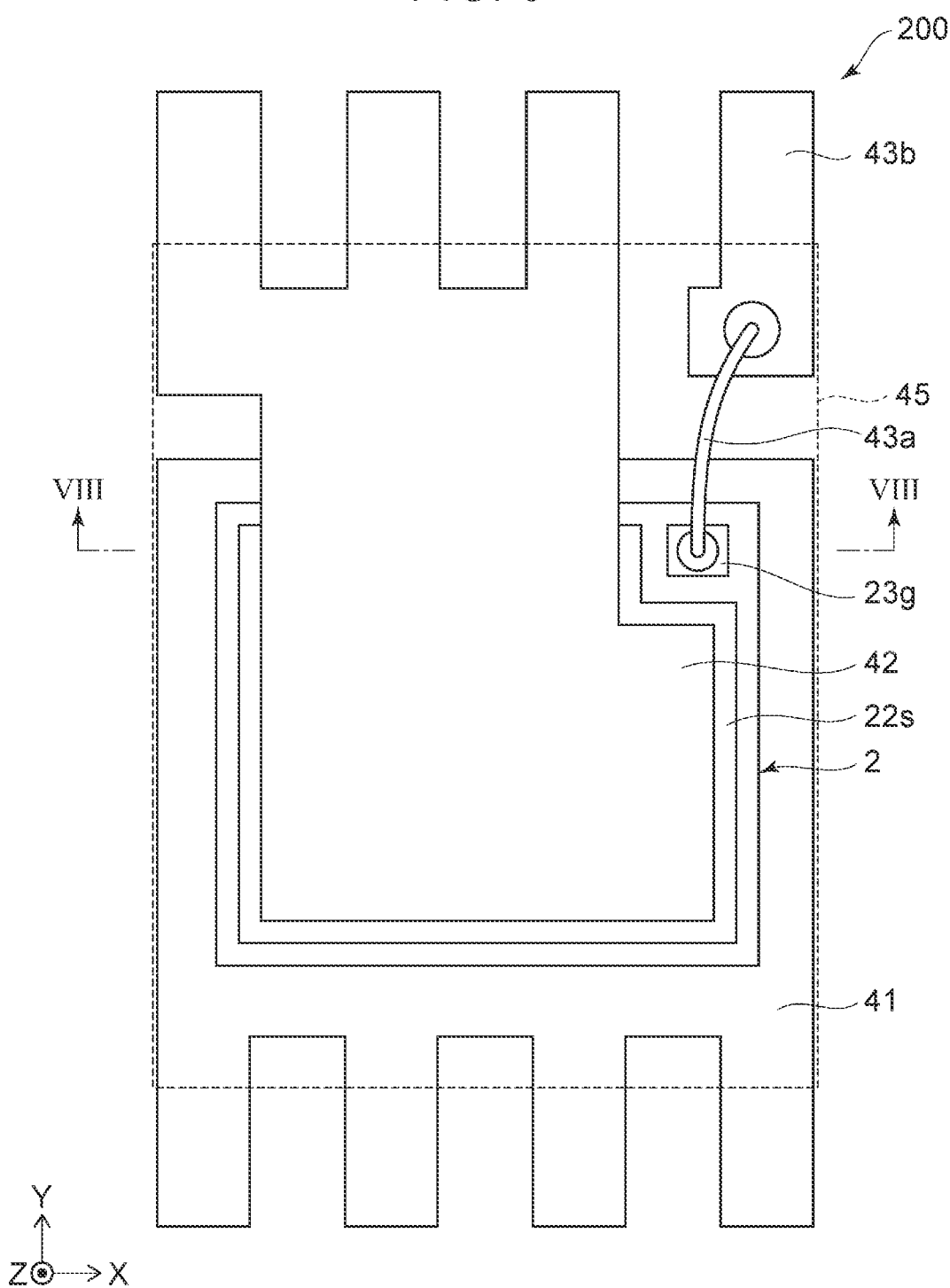
FIG. 9 is a plan view illustrating a semiconductor device according to a second embodiment.

FIG. 8 is a cross-sectional view illustrating a semiconductor device according to the second embodiment. FIG. 9 is a plan view illustrating the semiconductor device according to the second embodiment.

As illustrated in FIG. 8 and FIG. 9, the semiconductor device 200 according to the second embodiment includes a semiconductor chip 2, a lead frame 41 (a first metallic member), a lead frame 42 (a second metallic member), a bonding wire 43a (a third metallic member), a lead terminal 43b, an insulating member 45, and junction layers 51 to 53. In FIG. 9, the insulating member 45 is indicated by a dashed line.

The semiconductor chip 2 is joined to the upper surface of the lead frame 41 via the junction layer 51. The drain electrode 21d and the metallic layer 30 of the semiconductor chip 2 are electrically connected to the lead frame 41. The lead frame 42 is joined to the upper surface of the source electrode 22s via the junction layer 52 and is electrically connected to the source electrode 22s. One end of the bonding wire 43a is joined to the gate pad 23g, and the other end of the bonding wire 43a is joined to the lead terminal 43b. The gate pad 23g is electrically connected to the lead terminal 43b via the bonding wire 43a.

The structure of the semiconductor device 200 is not limited to the illustrated example. Instead of the bonding wire 43a and the lead terminal 43b, as with the semiconductor device 100, one lead frame 43 may be joined to the gate pad 23g via the junction layer 53. Instead of the lead frame 42, a bonding wire and a lead terminal may be provided.

The insulating member 45 is provided surrounding the semiconductor chip 2 and functions to encapsulate the semiconductor chip 2. A part of each lead frame and a part of the lead terminal 43b are left exposed externally (not covered with the insulating member 45).

The gate electrode 20 comprises a conductive material such as polysilicon. Each of the gate insulating layer 20a and the insulating layer 20b comprises an insulating material such as silicon oxide, silicon nitride, or silicon oxynitride. Each of the drain electrode 21d, the source electrode 22s, and the gate pad 23g comprises a metal such as titanium, aluminum, or copper. The bonding wire 43a comprises a metal such as aluminum. The lead terminal 43b comprises a metal such as copper.

With the semiconductor chip 2 and the semiconductor device 200 according to the second embodiment, heat generated at the third portion 10c is still less easily discharged from the semiconductor layer 10 as compared with heat generated at the first portion 10a and heat generated at the second portion 10b. However, the semiconductor chip 2 includes the metallic layer 30 in a manner similar to the semiconductor chip 1. The metallic layer 30 is provided under the drain electrode 21d and is located directly below the third portion 10c. This makes heat more easily discharged from the third portion 10c, as with the first embodiment, so that it is possible to prevent or reduce thermal runaway in the semiconductor chip 2.

In semiconductor chip 2, as with the semiconductor chip 1, it is preferable that the thickness of the metallic layer 30 is in a range of 0.1 times to 0.5 times the thickness of the junction layer 51. More preferably, the thickness of the metallic layer 30 is in a range of 0.1 times to 0.2 times the thickness of the junction layer 51. Moreover, it is preferable that the width W of the metallic layer 30 as illustrated in FIG. 6 is in a range of 0.5 times to 2.0 times the distance D between the source electrode 22s and the gate pad 23g.

Modification Example

Figure 10:
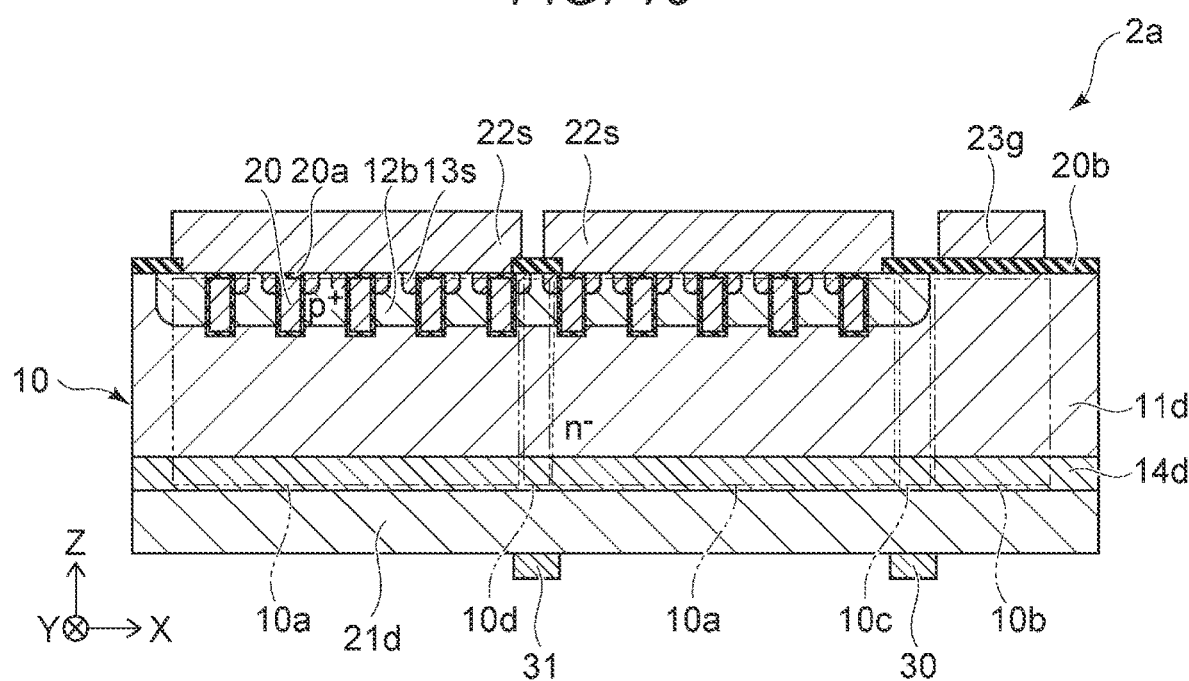
FIG. 10 is a cross-sectional view illustrating a semiconductor chip according to a modification example of a second embodiment.
Figure 11A:
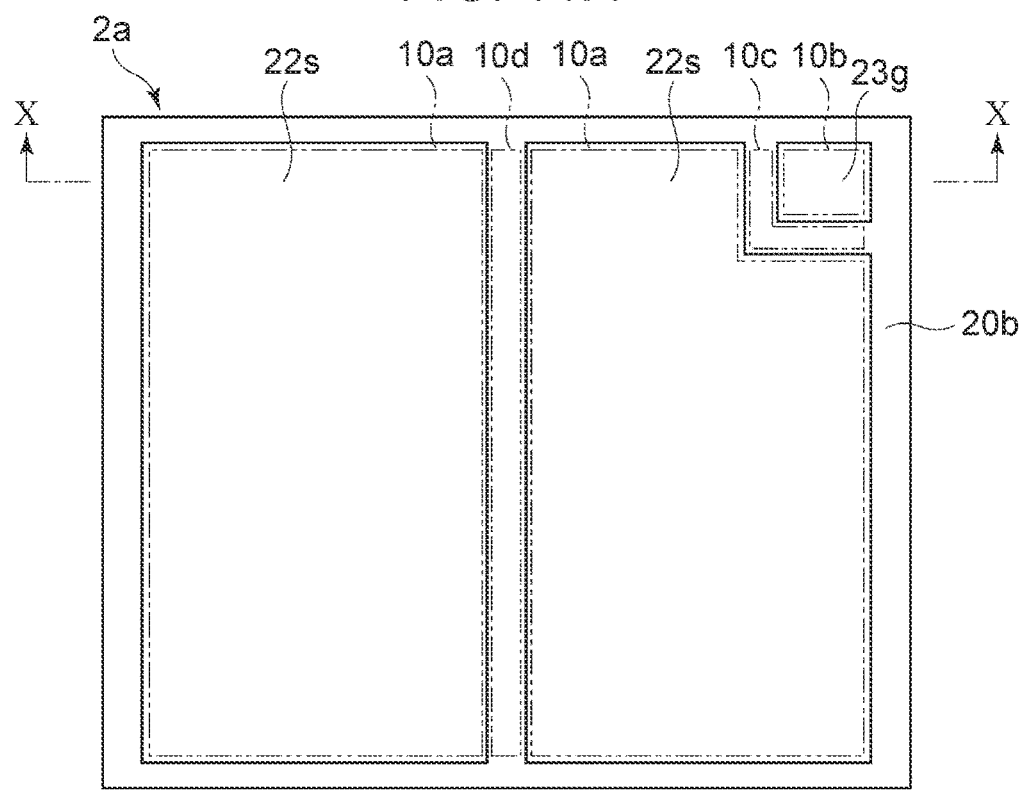
FIG. 11A is a top view illustrating a semiconductor chip according to a modification example of a second embodiment.
Figure 11B:
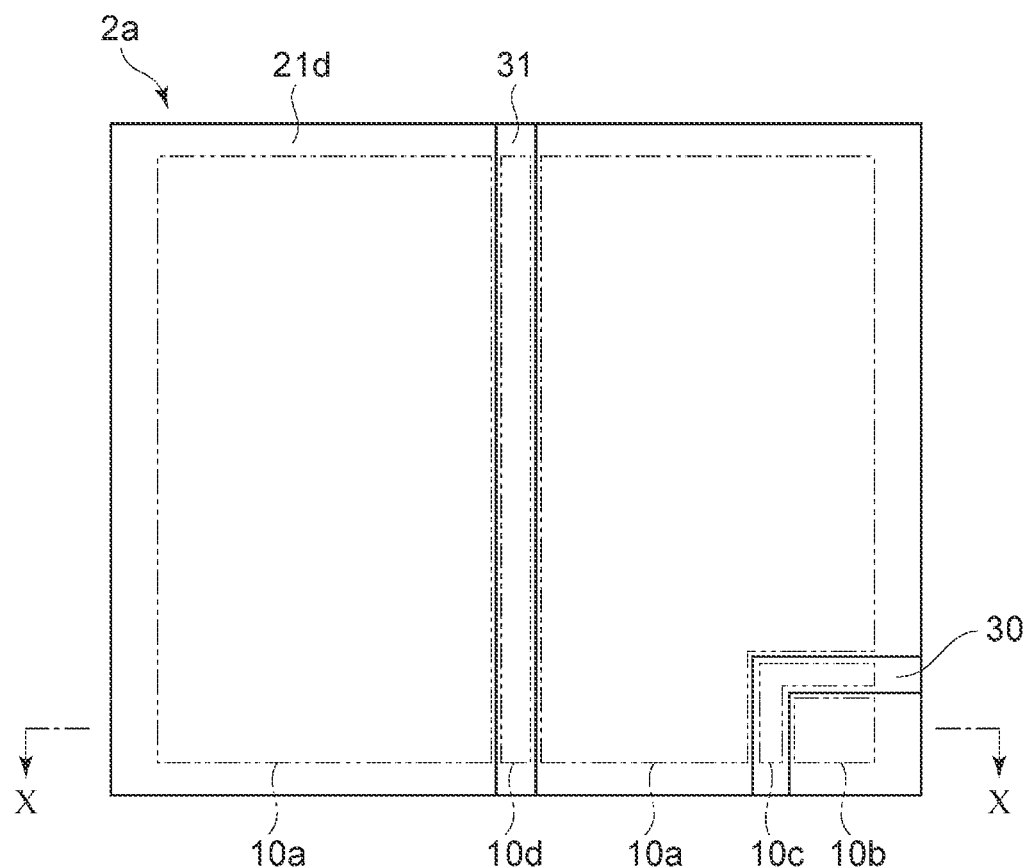
FIG. 11B is a bottom view illustrating a semiconductor chip according to a modification example of a second embodiment.

FIG. 10 is a cross-sectional view illustrating a semiconductor chip according to a modification example of the second embodiment. FIG. 11A is a top view illustrating the semiconductor chip according to a modification example of the second embodiment. FIG. 11B is a bottom view illustrating the semiconductor chip according to a modification example of the second embodiment. FIG. 10 is equivalent to cross-sectional views taken along line X-X in FIG. 11A and FIG. 11B.

As illustrated in FIG. 10 and FIG. 11A, the semiconductor chip 2a according to the modification example differs from the semiconductor chip 2 in that a plurality of source electrodes 22s is provided along with a metallic layer 31 being further provided.

The semiconductor layer 10 includes first portions 10a, a second portion 10b, a third portion 10c, and a fourth portion 10d. The third portion 10c is located between one of the first portions 10a and the second portion 10b. The fourth portion 10d is located between a pair of adjacent first portions 10a.

The source electrodes 22s are provided over each of the first portions 10a, respectively. The source electrodes 22s are separated from each other in the X-direction. One of the source electrodes 22s is electrically connected to some of a plurality of p-type base regions 12b and some of a plurality of n+-type source regions 13s. Another source electrodes 22s is electrically connected to different ones of the plurality of p-type base regions 12b and a different ones of the plurality of n+-type source regions 13s.

As illustrated in FIG. 10 and FIG. 11B, the metallic layer 31 is provided under the drain electrode 21d and is located below the fourth portion 10d. The metallic layer 31 and a gap between the source electrodes 22s are aligned in the Z-direction. The other elements of the semiconductor chip 2a are substantially similar to the elements of the semiconductor chip 2.

Figure 12:
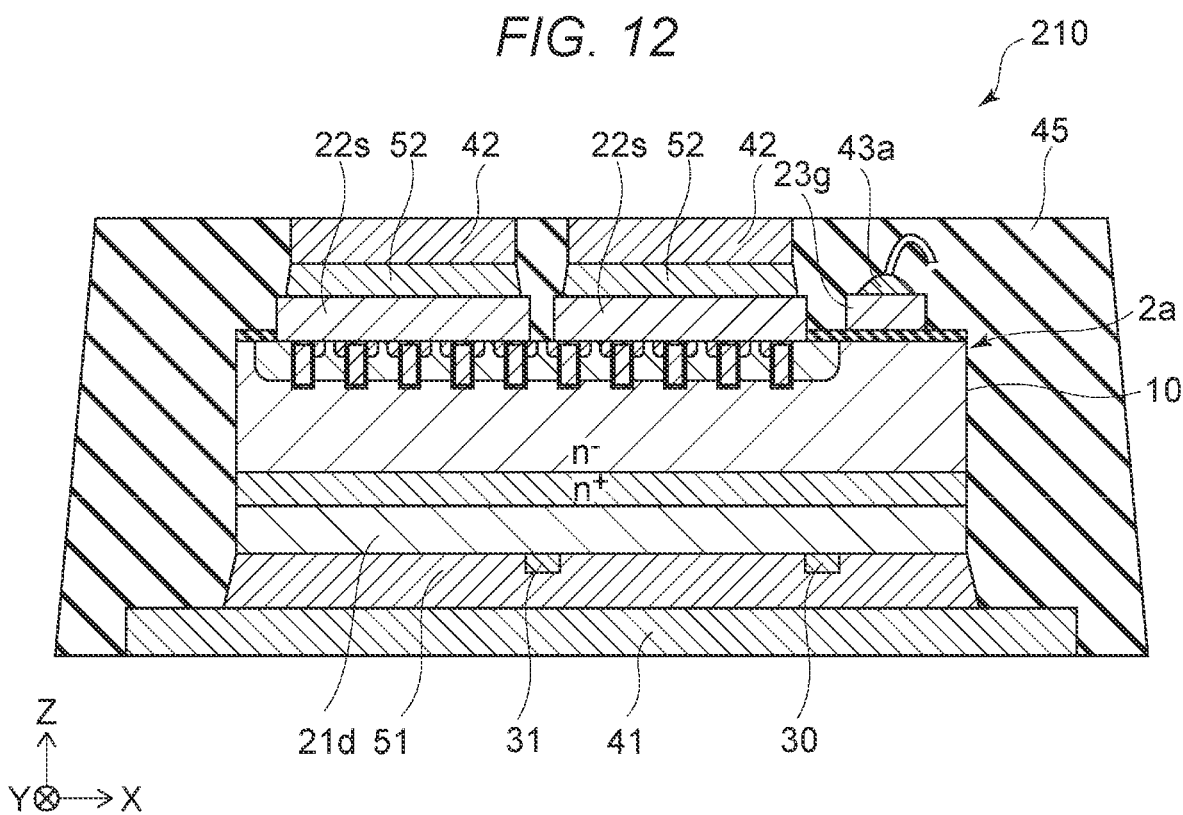
FIG. 12 is a cross-sectional view illustrating a semiconductor device according to a modification example of a second embodiment.

FIG. 12 is a cross-sectional view illustrating a semiconductor device according to the modification example of the second embodiment.

As illustrated in FIG. 12, in the semiconductor device 210 according to the modification example, the drain electrode 21d, the metallic layer 30, and the metallic layer 31 are electrically connected to a lead frame 41. A plurality of lead frames 42 is electrically connected to the plurality of source electrodes 22s via a plurality of junction layers 52.

The other elements of the semiconductor device 210 are similar to the elements of the semiconductor device 200. The material used for the metallic layer 30 may be used as a material for the metallic layer 31.

In the semiconductor chip 2a according to the modification example, a plurality of source electrodes 22s is provided, with each source electrode 22s being separated from the others. Heat generated at the fourth portion 10d, which is located below a gap between adjacent ones of the plurality of source electrodes 22s is less able to be discharged from the semiconductor layer 10 as compared with heat generated at the first portions 10a and heat generated at the second portion 10b. Providing the metallic layer(s) 31 enables decreasing the density of voids V contained in the junction layer 51 below the fourth portion(s) 10d at the time of mounting of the semiconductor chip 2a. This makes heat more likely to be discharged from the fourth portion 10d, so that it is possible to prevent or reduce thermal runaway in the semiconductor chip 2a.

Third Embodiment

Figure 13:
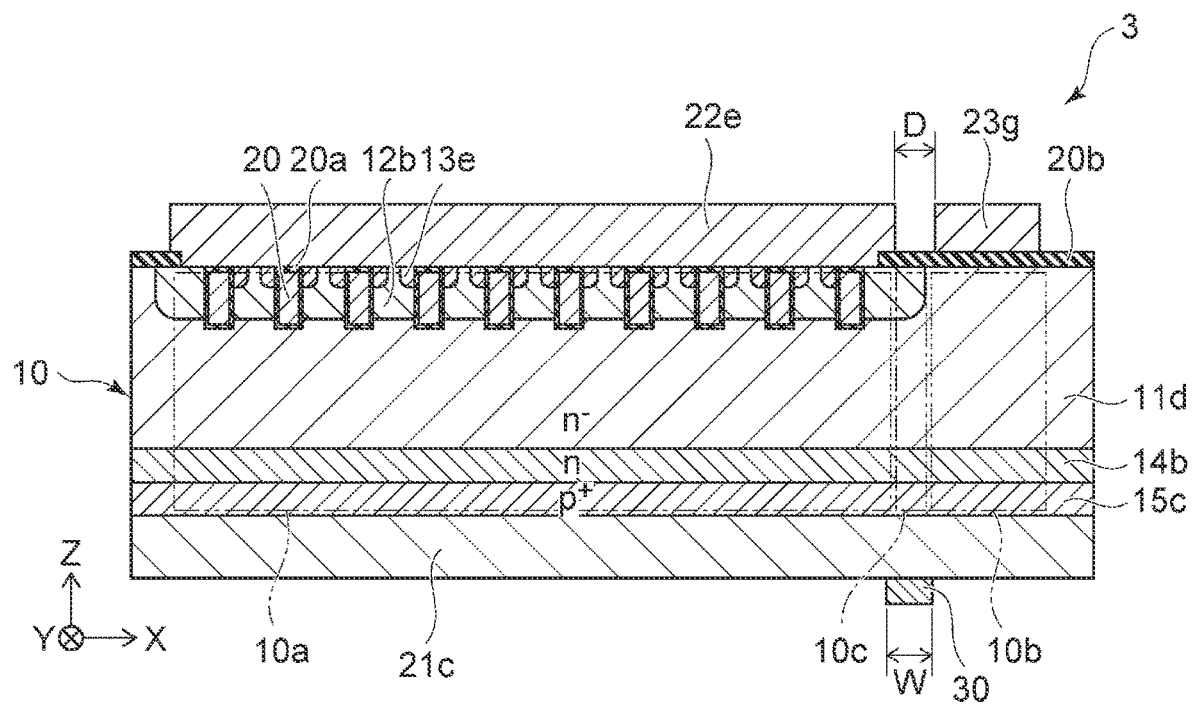
FIG. 13 is a cross-sectional view illustrating a semiconductor chip according to a third embodiment.

FIG. 13 is a cross-sectional view illustrating a semiconductor chip according to a third embodiment.

The semiconductor chip 3 according to the third embodiment is an IGBT. The semiconductor chip 3 illustrated in FIG. 13 includes a semiconductor layer 10, a gate electrode 20, a collector electrode 21c (a first electrode), an emitter electrode 22e (a second electrode), a gate pad 23g (a third electrode), and a metallic layer 30.

Configurations similar to those of the drain electrode 21d and the source electrode 22s may be applied to the collector electrode 21c and the emitter electrode 22e. The collector electrode 21c is provided at the lower surface side of the semiconductor chip 3. The semiconductor layer 10 is provided over the collector electrode 21c.

The semiconductor layer 10 in the semiconductor chip 3 differs from the semiconductor layer 10 in the semiconductor chip 2 in that an n-type buffer region 14b is provided instead of the n+-type drift region 14d, and a p+-type collector region 15c is provided. In the semiconductor chip 3, the n+-type source region 13s functions as an n+-type emitter region 13e.

The p+-type collector region 15c is provided over the collector electrode 21c and is electrically connected to the collector electrode 21c. The n-type buffer region 14b is provided over the p+-type collector region 15c. An n-type drift region 11d is provided over the n-type buffer region 14b. A p-type base region 12b is provided over the retype drift region 11d. The n+-type emitter region 13e is provided above the p-type base region 12b. The gate electrode 20 faces the p-type base region 12b via a gate insulating layer 20a.

The emitter electrode 22e is provided over the first portion 10a and the gate pad 23g is over the second portion 10b. The emitter electrode 22e is electrically connected to a plurality of p-type base regions 12b and a plurality of n⁺-type emitter regions 13e. The gate pad 23g is electrically connected to a plurality of gate electrodes 20.

When a positive voltage is applied to the collector electrode 21c with respect to the emitter electrode 22e, and a voltage higher than or equal to a threshold value is applied to the gate electrode 20 this causes a channel (an inversion layer) to be formed in the p-type base region 12b, so that the semiconductor chip 3 enters into an on-state. Electrons pass through the channel and flow from the emitter electrode 22e to the n⁻-type drift region 11d. In response to the flow of electrons, holes flow from the collector electrode 21c to the n⁻-type drift region 11d. Electrons and holes are accumulated in the n⁻-type drift region 11d and conductivity modulation occurs, so that the electrical resistance of the n⁻-type drift region 11d greatly decreases. When the voltage which is applied to the gate electrode 20 becomes lower than the threshold value, the channel in the p-type base region 12b disappears, so that the semiconductor chip 3 enters into an off-state.

Figure 14:
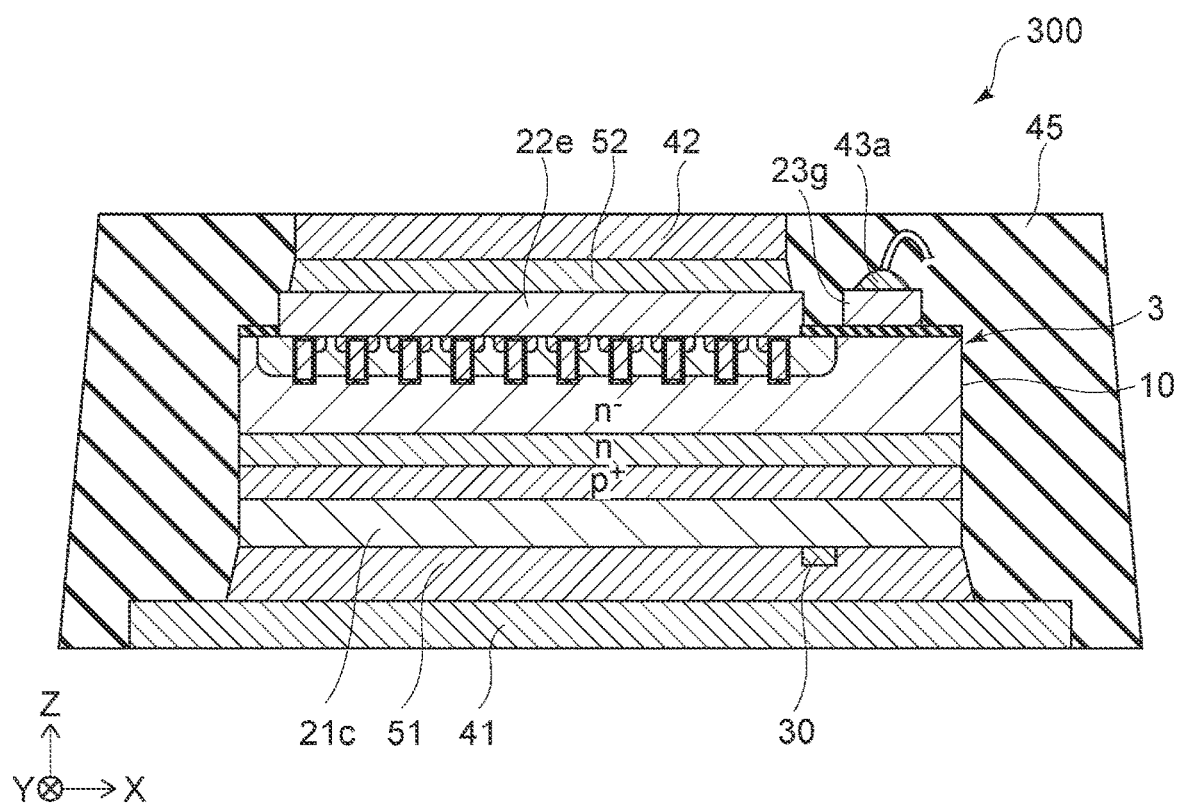
FIG. 14 is a cross-sectional view illustrating a semiconductor device according to a third embodiment.

FIG. 14 is a cross-sectional view illustrating a semiconductor device according to the third embodiment.

The configuration of the semiconductor device 300 according to the third embodiment illustrated in FIG. 14 is similar to the configuration of the semiconductor device 200 except that the semiconductor chip 3 is provided instead of the semiconductor chip 2.

According to the third embodiment, as with the second embodiment, heat is more easily discharged from the third portion 10c of the semiconductor chip 3, so that it is possible to prevent or reduce thermal runaway in the semiconductor chip 3.

As with the semiconductor chip 1, it is generally preferably that the thickness of the metallic layer 30 is in a range of 0.1 times to 0.5 times the thickness of the junction layer 51. More preferably, the thickness of the metallic layer 30 is in a range of 0.1 times to 0.2 times the thickness of the junction layer 51. Moreover, it is generally preferably that the width W of the metallic layer 30 is in a range of 0.5 times to 2.0 times the distance D between the emitter electrode 22e and the gate pad 23g.

In the above-described embodiments, the relative impurity concentration between respective semiconductor regions can be checked with use of, for example, a scanning capacitance microscope (SCM). The carrier concentration in each semiconductor region can be deemed to be equal to an impurity concentration which is activated in each semiconductor region. Accordingly, the relative highness and lowness of a carrier concentration between respective semiconductor regions can also be checked by use of an SCM. The impurity concentration in each semiconductor region may also be measured by a secondary ion mass spectrometry (SIMS).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor chip, comprising:
   a first electrode;
   a semiconductor layer on a first side of the first electrode;
   a second electrode on a first portion of the semiconductor layer that is between the first electrode and the second electrode in a first direction;
   a third electrode on a second portion of the semiconductor layer that is between the first electrode and the third electrode in the first direction; and
   a metallic layer on a second side of the first electrode, the metallic layer being aligned with a third portion of the semiconductor layer in the first direction, wherein
   the third portion of the semiconductor layer is between the first and second portions of the semiconductor layer in a second direction perpendicular to the first direction, and
   a width of the metallic layer in the second direction is equal to a width of a gap between the second and third electrodes in the second direction.

2. The semiconductor chip according to claim 1, wherein the metallic layer protrudes from a surface on the second side of the metallic layer in the first direction away from the first electrode.

3. The semiconductor chip according to claim 1, wherein the width of the metallic layer in the second direction is equal to a width of the third portion in the second direction.

4. The semiconductor chip according to claim 1, wherein the semiconductor layer includes:
   a first semiconductor region of a first conductivity type, the first semiconductor region spanning across the first portion of the semiconductor layer, the second portion of the semiconductor layer, and the third portion of the semiconductor layer in the second direction; and
   a second semiconductor region of a second conductivity type, the second semiconductor region being in the first portion of the semiconductor layer between the first semiconductor region and the second electrode in the first direction.

5. The semiconductor chip according to claim 4, wherein the first semiconductor region is electrically connected to the first electrode, and
   the second semiconductor region is electrically connected to the second electrode.

6. The semiconductor chip according to claim 5, further comprising:
   a gate electrode facing the second semiconductor region via a gate insulating layer, wherein
   the semiconductor layer further includes a third semiconductor region of the first conductivity type between the second semiconductor region and the second electrode in the first direction,
   the third semiconductor region is electrically connected to the second electrode, and
   the gate electrode is electrically connected to the third electrode.

7. The semiconductor chip according to claim 6, wherein the gate electrode extends in the first direction into the second semiconductor region.

8. The semiconductor chip according to claim 1, wherein the metallic layer is below some but not all of the first portion of the semiconductor layer in the first direction and below some but not all of the second portion of the semiconductor layer in the first direction.

9. The semiconductor chip according to claim 1, wherein the metallic layer comprises at least one of copper and silver.

10. A semiconductor device, comprising:
a first electrode;
a semiconductor layer on a first side of the first electrode;
a second electrode on a first portion of the semiconductor layer that is between the first electrode and the second electrode in a first direction;
a third electrode on a second portion of the semiconductor layer that is between the first electrode and the third electrode in the first direction;
a metallic layer on a second side of the first electrode, the metallic layer being aligned with a third portion of the semiconductor layer in the first direction; a first metallic member joined to the first electrode and the metallic layer via a first junction layer;
a second metallic member joined to the second electrode; and
a third metallic member joined to the third electrode, wherein
the third portion of the semiconductor layer is between the first and second portions of the semiconductor layer in a second direction perpendicular to the first direction,
a first part of the first junction layer is between the first metallic member and the metallic layer in the first direction,
a second part of the first junction layer is not between the first metallic member and the metallic layer in the first direction, and
a density of voids in the first part of the first junction layer is less than a density of voids in the second part of the first junction layer.

11. The semiconductor device according to claim 10, wherein a distance from the first metallic member to the metallic layer in the first direction is less than a distance from the first metallic member to the first electrode in the first direction.

12. The semiconductor device according to claim 10, wherein a thickness of the metallic layer is less than 0.5 times a thickness of the first junction layer.

13. A packaged semiconductor device, comprising:
a semiconductor chip including:
a first electrode;
a semiconductor layer on a first side of the first electrode;
a second electrode on a first portion of the semiconductor layer that is between the first electrode and the second electrode in a first direction;
a third electrode on a second portion of the semiconductor layer that is between the first electrode and the third electrode in the first direction; and
a metallic layer on a second side of the first electrode, the metallic layer being aligned with a third portion of the semiconductor layer in the first direction;
a first lead frame portion joined to the first electrode via a first junction layer;
a second lead frame portion electrically connected to the second electrode; and
a third lead frame portion electrically connected to the third electrode, wherein
the third portion of the semiconductor layer is between the first and second portions of the semiconductor layer in a second direction perpendicular to the first direction, and
the semiconductor layer includes:
a first semiconductor region of a first conductivity type, the first semiconductor region spanning across the first portion of the semiconductor layer, the second portion of the semiconductor layer, and the third portion of the semiconductor layer in the second direction; and
a second semiconductor region of a second conductivity type, the second semiconductor region being in the first portion of the semiconductor layer between the first semiconductor region and the second electrode in the first direction.

14. The packaged semiconductor device according to claim 13, wherein
the first semiconductor region is electrically connected to the first electrode, and
the second semiconductor region is electrically connected to the second electrode.

15. The packaged semiconductor device according to claim 14, further comprising:
a gate electrode facing the second semiconductor region via a gate insulating layer, wherein
the semiconductor layer further includes a third semiconductor region of the first conductivity type between the second semiconductor region and the second electrode in the first direction,
the third semiconductor region is electrically connected to the second electrode, and
the gate electrode is electrically connected to the third electrode.

16. The packaged semiconductor device according to claim 13, wherein the second and third lead frame portions are electrically connected.

17. The packaged semiconductor device according to claim 13, wherein the third electrode is electrically connected to the third lead frame portion by a bonding wire.

* * * * *